United States Patent [19]

Bonhomme

[11] Patent Number: 4,483,576
[45] Date of Patent: Nov. 20, 1984

[54] CONNECTOR FOR PRINTED-CIRCUIT BOARDS

[76] Inventor: Francois R. Bonhomme, 6 Parc de Béarn, 92 210 Saint Cloud, France

[21] Appl. No.: 465,099

[22] Filed: Feb. 9, 1983

[30] Foreign Application Priority Data

Feb. 12, 1982 [FR] France ............................... 82 02293

[51] Int. Cl.$^3$ ............................................. H01R 9/11
[52] U.S. Cl. .......................... 339/17 F; 339/176 MF; 339/176 MP
[58] Field of Search ....... 339/17 F, 176 MF, 176 MP

[56] References Cited

U.S. PATENT DOCUMENTS

| | | | |
|---|---|---|---|
| 3,158,421 | 11/1964 | Hasenauer, Jr. | 339/176 MF |
| 3,319,216 | 5/1967 | McCullough | 339/17 F |
| 3,341,806 | 9/1967 | Joachim | 339/192 |
| 3,941,448 | 5/1976 | Evans | 339/176 MF |
| 4,029,374 | 6/1977 | Nestor et al. | 339/17 F |
| 4,080,027 | 3/1978 | Benasutti | 339/17 F |
| 4,392,700 | 7/1983 | Shonman et al. | 339/176 MP |

FOREIGN PATENT DOCUMENTS 1304823 10/1962 France .
1096938 12/1967 United Kingdom .

Primary Examiner—John McQuade
Attorney, Agent, or Firm—Larson & Taylor

[57] ABSTRACT

In order to connect to output pins (21) the conductive tracks carried by edge portions of a printed-circuit board (1) a connector (12) is provided with elastically-yieldable contacts (22) which connect said tracks to tracks carried by a sheet (17), the last-mentioned tracks leading to conductive pins (21).

13 Claims, 4 Drawing Figures

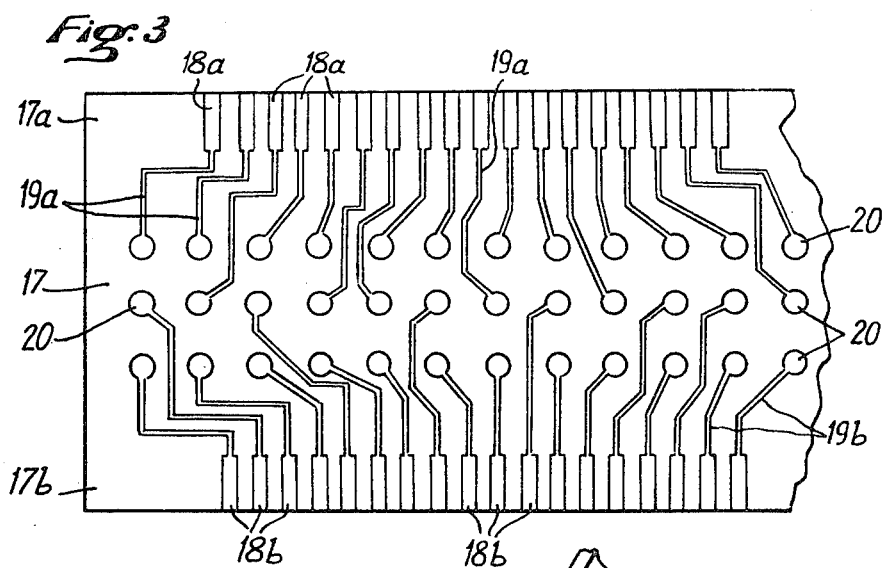
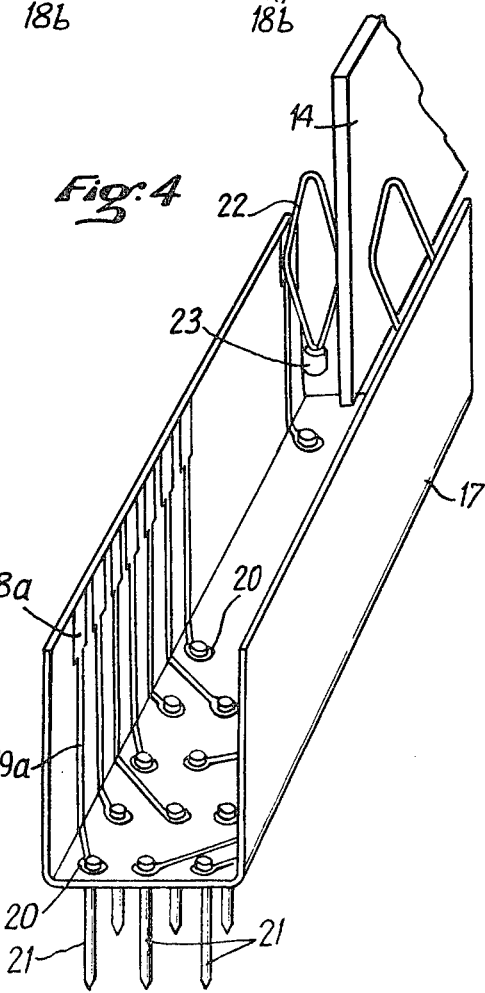

CONNECTOR FOR PRINTED-CIRCUIT BOARDS

The present invention relates to a connector for printed-circuit boards and in particular for boards having printed circuits on both sides.

It is known that the connectors for printed-circuit boards usually comprise a case in which is disposed a plurality of contacts aligned at the pitch of the printed contact tracks located along the edge on one or both sides of the printed-circuit board. These individual contacts are themselves usually connected to conductor wires through a permanent connection; for example, through wrapping, setting, welding etc. In order to have the required place and in order to avoid rendering the tools effecting the connections excessively fragile, the contact stems for connection to the wires are spaced apart in accordance with a relatively large pitch, usually of 2.54 mm. When the connection tracks of the printed-circuit board are themselves disposed in accordance with this pitch, as for example 2.54 mm, the connector may then have a simple shape with a plurality of contacts identical to each other. However, such printed-circuit boards have an unnecessarily large surface area for placing the components which, owing to technical progress, are increasingly minaturized. In accordance with this miniaturization, it has therefore been arranged to decrease the pitch between the tracks of the printed-circuit board, the chosen pitch being usually of 1.587 mm and even 1.27 mm. For such reduced-pitch boards, it would therefore be conceivable to employ connectors whose individual contacts would themselves be disposed at this reduced pitch, but the distance between the output stems then becomes too small to permit effecting the connections with the cables or wires under good conditions. This is why it seems preferable to employ connectors with individual contacts at the pitch of the printed-circuit, for example of 1.587 mm or 1.27 mm, whereas the contact outputs, for example the contact stems, are disposed at the larger usual pitch, of 2.54 mm.

One arrangement could consist in employing connectors with individual contacts of a plurality of different geometrical types, which would provide contacts which are arranged, in the region of the printed-circuit tracks, at the closer pitch of the latter but whose outputs would be disposed at the wider usual pitch. However, such an arrangement would be extremely complicated and would require the fabrication of elements of various models. Further, in the frequent case where the printed-circuit boards have tracks on both sides, the geometry of such an assembly would become particularly complex.

An object of the invention is therefore to overcome these drawbacks and to provide a new connector for printed-circuit boards having tracks located in accordance with a pitch of reduced dimension with connector connecting outputs disposed at a larger pitch.

Another object of the invention it to provide such a connector whose overall longitudinal size is only slightly larger than the overall longitudinal size of the contact tracks presented by the board edge.

Another object of the invention is to provide such a connector which permits the arrangement of the outputs at the desired pitch in a number of rows exceeding the number of rows of the printed-circuit board, namely one row for a board printed on a single side or two rows for a board printed on both sides.

A further object of the invention is to provide such a connector which employs only individual contacts of a single geometrical type.

A still further object of the invention is to provide such a device which has only a reduced number of components of simple shape and easy to assemble.

A still further object of the invention is to provide such a connector in which the components ensuring the contact with the printed-circuit board and the connector output may be employed without modification for connectors having given pitches which differ within a rather wide range.

The invention provides a connector for printed-circuit boards of the type comprising a case, a plurality of individual contacts disposed at the pitch of a printed-circuit board and individual outputs, for example connection stems, for the connection of conductors, wires, or cables, wherein there are provided, in the case, one or two rows of deformable individual contacts disposed at the pitch of the tracks of the corresponding side of the printed-circuit board, a plurality of rows of output elements, such as for example connection stems, namely one per individual contact, disposed at a pitch larger than the pitch of said tracks, in a number of rows larger than the number of rows of individual contacts, said output elements preferably extending out of the case, and a printed sheet having a plurality of conductors associated with the individual contacts so as to form, at least on one end of said sheet, a plurality of conductive tracks which individually come into contact with said individual contacts, the other ends of said printed conductors being disposed along the rows of said output elements and at the pitch of the output elements.

Thus, for example, in the case of a printed-circuit board having two sides, the tracks of which are at the pitch of 1.587 mm or 1.27 mm, the connection outputs are advantageously disposed along three rows at the pitch of 2.54 mm.

In the preferred case in which the connector, adapted to receive a board having printed circuits on both sides, has for this purpose two parallel rows of individual contacts, the printed sheet has on two edge portions, preferably on the same side thereof, two alignments of tracks at the pitch of said contacts, the individual printed conductors terminating along said rows at the enlarged pitch of the output elements in the central region of the board.

Advantageously, said sheet is made from a flexible material which enables it to be folded either in an L-shape if it concerns a connector having a single row of contacts, or in a U-shape when the connector comprises two rows of contacts, which permits easily disposing the output elements, such as for example contact stems or pins in directions parallel to the plane of the printed-circuit board.

There may be advantageously employed, as individual contacts, closed or open deformable spring metal loops which are maintained perpendicularly to the planes of the board tracks and sheet tracks, so that the introduction of the board into the case produces a compression of the loop whose two ends, which are preferably diametrically opposed, are then in contact, one with a board track, and the other with the corresponding track of the sheet. Advantageously, these loops may have a diamond shape and be associated with immobilizing means which ensures that they are maintained in their own plane and are immobilized inside the cavity therefor.

The output elements, such as the stems or pins, may be advantageously mounted in such manner as to perforate the sheet at places aligned along the rows of output elements, at the enlarged pitch of said elements, each individual printed conductor leading to one of these points of perforation so as to achieve an electric contact by perforation of a known type.

Preferably, the connector case has a substantially U-shaped cross-section receiving the sheet folded in the shape of a U, said sheet being maintained by an element which, in filling the case, maintains the sheet in its folded U-shaped position, immobilizes the output elements which extend through the bottom of the case and receives, in cavities the individual contacts suitably immobilized in this element.

Further advantages and features of the invention will be apparent from the ensuing description which is given merely by way of example with reference to the accompanying drawings, in which:

FIG. 3 is a view of the flexible sheet.

FIG. 4 is a view of the sheet folded in the shape of a U.

Figure 1:
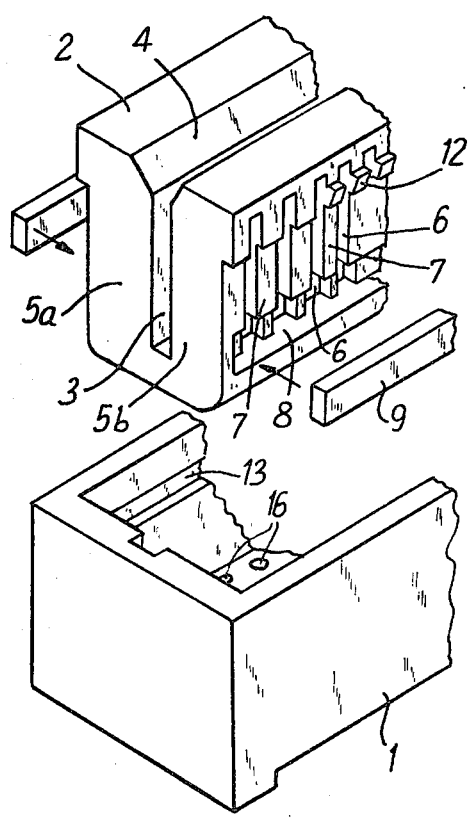
FIG. 1 is an exploded diagrammatic view of the case of the device according to the invention.
Figure 2:
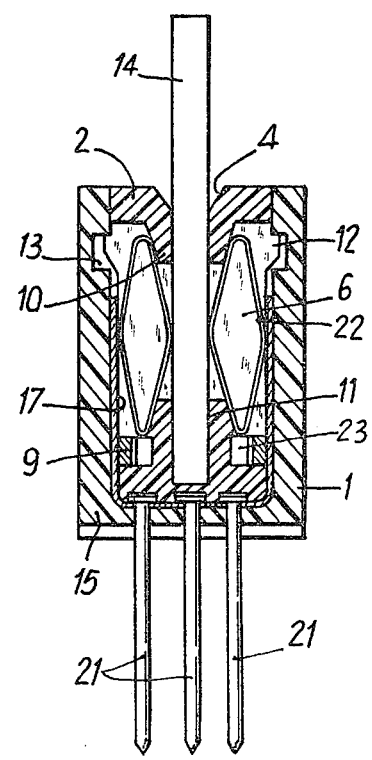
FIG. 2 is a cross-sectional view of the connector according to the invention.

The illustrated connector comprises an elongated case 1 of parallelepipedic shape capable of receiving a moulded element 2 having a generally U-shape with a centre slot 3 whose opening is bordered by a chamfer 4 for the introduction of a printed-circuit board. The element 2 is placed in position in the case 1 which it closes, as can be seen in FIG. 2. In each of the branches 5a and 5b of the U-section, this element 2 comprises a plurality of throughway cavities 6 which extends transversely of the slot 3 and open, on one hand, onto the slot 3 and, on the other hand, onto the outer lateral side of the element 2. Two successive cavities 6 define therebetween transverse walls 7 whose parts connected to the base 8 of the element 2 are set back from the outer lateral side of each branch 5a, 5b so that it is possible to house a longitudinal bar 9 flush with said wall. The shape of the cavities 6 can be clearly seen in FIG. 2 and it is clear that the thickness of each wall 7 between two cavities is constant except for the parts of the wall located in the region of the base 8 and adapted to form a recess for receiving the bar 9. In FIG. 2, it can be seen in particular that the cavities 6 open onto the centre slot 3 by way of an opening which has the width of the cavity (in the longitudinal direction of the case) but a height which is reduced relative to the height of the cavity when it opens out onto the outer surface of the branch 5a or 5b owing to the presence of corresponding inclined edges, namely an upper edge 10 and a lower edge 11.

Further, the outer lateral surfaces of the branches 5a and 5b have on the walls 7, or on at least some thereof, lugs 12 capable of penetrating the grooves 13 of the lateral walls of the case 1. Thus, when the element 2 is mounted in the case 1, these lugs 12 move away upon the introduction owing to the resilience of the two branches 5a and 5b and, thereafter, the lugs, in penetrating the grooves 13, prevent the extraction of the element 2 from the case 1. In this assembled position, it can be seen that the opening corresponding to the slot 3 is just sufficient to allow the plugging-in of a printed-circuit board 14.

It will also be observed that the bottom 15 of the case has three rows of outlet apertures 16. The apertures 16 are disposed, in each of the three rows, at the pitch of 2.54 mm while the cavities 6 are at the pitch of 1.587 mm or 1.27 mm.

With reference more particularly to FIGS. 3 and 4, it can be seen that the sheet 17 of the connector according to the invention, formed by a sheet of flexible synthetic material, for example sold under the trademark MYLAR, has on each of its edge portions 17a, 17b a plurality of printed conductive tracks 18a, 18b located in opposed relation and at the reduced pitch of 1.587 mm or 1.27 mm. These tracks lead by way of printed conductors 19a, 19b respectively to circular printed conductive areas 20 disposed in three or four rows at the pitch of 2.54 mm for example. The diameter of each printed area 20 is large enough for ensuring, when the sheet is perforated by a pin 21 at the place of the area, an electric contact between the pin and, by way of the area 20 and the conductor 19a or 19b, the track 18a or 18b respectively. The areas 20 and the conductors 19 are the remainders of a metal layer which initially covered the whole of the sheet and which was selectively etched with acid. Then, prior apertures were formed with precision in the sheet at the centre of the areas 20, before the final piercing by means of the pins 21.

In the embodiment illustrated in the drawing, it can be seen that each track 18a, 18b is connected solely to a single area 20, but it will be understood that the printing could be modified in any way, as the application of the tracks in the areas 20 may be of any functional nature. In other words, a track such as 18a or 18b may be connected to a plurality of areas 20 or an area 20 may be connected to a plurality of tracks.

In each cavity 6, there is disposed an individual contact 22 which is constructed in the form of a conductive metal wire loop folded into the shape of a diamond and having two lower ends assembled in a set on formed-over cylinder 23. The dimension of the small diagonal of the diamonds constituted by the contacts 22 is so determined at rest that one of the apices of the small diagonal is applied against one of the tracks 18a or 18b while the other penetrates the interior of the slot 3.

FIG. 2 shows the position of the individual contacts 22 whose set bases 23 are received in the bottoms of the cavities 6 and maintained immobilized therein by the bars 9. In this position, the diamond-shaped contacts 22 remain maintained in the position shown in FIGS. 2 and 4, i.e. transversely of the longitudinal plane of the slot 3, with no possibility of deviating to marked extent from their plane owing to the proximity of the walls 7 between the cavities 6. It can also be seen that the movement of the contacts 22 toward the slot 3 is limited by the presence of the portions 10 and 11 which border the openings of the cavities adjacent to the centre.

For the assembly, the pins or output stems 21 are first of all placed in position by perforating the sheet in the region of the prior apertures of the areas 20 so as to bring the end of the pin 21 into electric contact with the conductive printed track, which establishes an electric contact between the pin 21 and the corresponding track 18a or 18b, the pin being thereafter held fast by soldering, setting, or a like process. The sheet 17 with its pins is placed in position in the case 1 so that the pins extend through the apertures 16, as shown in FIG. 2. Preferably, the sheet 17 was previously folded in the shape of a U by temporarily heating it so as to facilitate its introduction in the case. The sheet 17 in this way assumes or conserves a folded U-shape as can be seen clearly in FIGS. 2 and 4, with its centre portion applied against the bottom of the case 15 and two lateral branches whose edge portions carry the tracks 18a and 18b respectively.

The individual contacts 22 are mounted separately in the cavities 6 of the element 2 and the contacts are immobilized by placing the bars 9 in position. The assembly is then introduced in the case until the configuration shown in FIG. 2 is obtained, in which the centre portion of the sheet 17 is maintained against the bottom 15 of the case by the lower end of the element 2, which immobilizes the connection pins 21. At the same time, the lateral portions of the sheet are applied against the respective sides of the case, which has for effect to lock the bars 9 and consequently immobilize the set base 23 of the contacts 22.

The contacts 22 are themselves elastically applied by one of their small apices each time against a track 18a or 18b while the diametrically opposed apex projects into the slot 3.

If a board 14 is then introduced in the slot 3, as shown in FIG. 2, the board tracks, at the pitch of 1.587 mm or 1.27 mm, come into contact with the apices of the contacts 22 which projected into the slot 3 and urge them laterally outwardly so that the electric contacts 22 are applied, with a sufficiently elastically yieldable pressure to ensure a good electric continuity, both against the tracks of the printed circuit board 14 and against the tracks 18a or 18b. The electric continuity is thus ensured in a univocal manner in the illustrated embodiment between each printed-circuit board track and the corresponding pin 21.

In this way, the pins 21 are arranged in at least three manners at a pitch distinctly larger than the pitch of the printed-circuit tracks and of the individual contacts. Consequently, printed-circuit boards may be employed which have tracks which are very close to each other while the connection stems or pins 21 are disposed at a relatively large pitch which presents no problem for the connection to conductor wires, for example by setting, wrapping or soldering.

It will of course be understood that a similar connector could be employed with a single row and not two rows of contacts 22 for printed-circuit boards having tracks on only one side. In this case, if the pitches described in the embodiment are taken, only two rows of pins 21 can be used. However, it must be noted that a connector such as that illustrated in the drawing may also be employed for boards which have tracks on only one side, provided the connection pins 21 which correspond to that row of individual contacts 22 which is not concerned are left unutilized.

Although the invention has been described with reference to a particular embodiment, it must be understood that it is in no way intended to limit the scope of the invention thereto and that various formal or material modifications may be made therein without departing from the scope or spirit of the invention defined in the claims.

Having now described my invention, what I claim as new and desire to secure by Letters Patent is:

1. A connector for printed-circuit board, which board has tracks spaced apart at a given pitch, said connector comprising a case, said connector further comprising, in the case, at least one row of deformable individual contacts, disposed at the pitch of said tracks of a corresponding side of the printed-circuit board, a plurality of rows of individual output elements, there being one output element per individual contact, said output elements being disposed at a pitch larger than the pitch of said contacts and in a number of rows exceeding the number of rows of said individual contacts, and a printed sheet having a plurality of printed conductors for forming, at least on one end portion of said sheet, a plurality of conductive tracks which individually contact said individual contacts, said printed conductors having end portions which are disposed along the rows of said output elements and at the pitch of said output elements so as to establish an electric contact therewith.

2. A connector according to claim 1, wherein said individual contacts are disposed at a pitch of 1.587 mm and said output elements are disposed at a pitch of 2.54 mm.

3. A connector according to claim 1, wherein said individual contacts are disposed at a pitch of 1.27 mm and said output elements are disposed at a pitch of 2.54 mm.

4. A connector according to claim 2, comprising two rows of said individual contacts, and three rows of said output elements.

5. A connector according to claim 3, comprising two rows of said individual contacts, and three rows of said output elements.

6. A connector according to claim 1, wherein the sheet has on two edge portions on the same side of the sheet, two alignments of tracks at the pitch of said individual contacts.

7. A connector according to claim 1, wherein said sheet is folded into the shape of a U inside the case and an element introduced in the case maintains the U-shaped sheet in the U-shaped position in the case.

8. A connector according to claim 1, wherein said individual contacts comprise deformable elastically-yieldable metal loops which are maintained perpendicularly to planes containing the tracks of the printed-circuit board and to planes containing the sheet tracks so that the introduction of the board in the case of the connector produces a compression of the loops for a simultaneous elastically yieldable contact with the corresponding track of the printed-circuit board and with the corresponding track of the sheet.

9. A connector according to claim 8, wherein said loops have a diamond shape.

10. A connector according to claim 1, wherein said output elements extend through the sheet by way of perforations in areas of said printed conductors.

11. A connector according to claim 1, wherein the case has a substantially rectangular, cross-sectional shape and a bottom wall defining apertures for the passage of said output elements and an element which has a central slot and two branches defining said slot, maintains the sheet folded into a U-shape in the case, a plurality of through-way cavities are provided in said branches and receive said individual contacts so that a part of the individual contacts projects into said slot, retaining means cooperate with the element for maintaining the element in the case, and the positioning of said element ensures the maintenance of the sheet in said folded position thereof, the fixing of the output elements in their position in a plurality of rows and the maintenance of the individual contact elements in their cavities.

12. A connector according to claim 11, wherein said individual contacts comprise deformable elastically-yieldable metal loops which are maintained perpendicularly to planes containing the tracks of the printed-circuit board and to planes containing the sheet tracks so that the introduction of the board in the case of the connector produces a compression of the loops for a simultaneous elastically yieldable contact with the corresponding track of the printed-circuit board and with the corresponding track of the sheet, the individual contacts each have a base, and bars which penetrate said element and are definitively fixed in position by the introduction of said element in the case, are cooperative with said bases for maintaining the bases in position in the cavities.

13. A connector according to claim 12, wherein said loops have a diamond shape.

* * * * *